United States Patent
Jiang

(10) Patent No.: US 10,254,610 B2
(45) Date of Patent: Apr. 9, 2019

(54) 3T PIXEL STRUCTURE AND RELATED LIQUID CRYSTAL DISPLAY

(71) Applicant: SHENZHEN CHINA STAR OPTOELECTRONICS TECHNOLOGY CO., LTD., Shenzhen, Guangdong (CN)

(72) Inventor: Xiangwei Jiang, Guangdong (CN)

(73) Assignee: SHENZHEN CHINA STAR OPTOELECTRONICS TECHNOLOGY CO., LTD., Shenzhen, Guangdong (CN)

(*) Notice: Subject to any disclaimer, the term of this patent is extended or adjusted under 35 U.S.C. 154(b) by 185 days.

(21) Appl. No.: 15/121,927

(22) PCT Filed: Jun. 16, 2016

(86) PCT No.: PCT/CN2016/086008
§ 371 (c)(1),
(2) Date: Aug. 26, 2016

(87) PCT Pub. No.: WO2017/197693
PCT Pub. Date: Nov. 23, 2017

(65) Prior Publication Data
US 2018/0149939 A1    May 31, 2018

(30) Foreign Application Priority Data
May 20, 2016  (CN) .......................... 2016 1 0339274

(51) Int. Cl.
*H01L 31/00*   (2006.01)
*G02F 1/1362*   (2006.01)
(Continued)

(52) U.S. Cl.
CPC ...... *G02F 1/136286* (2013.01); *G02F 1/1368* (2013.01); *G02F 1/13624* (2013.01);
(Continued)

(58) Field of Classification Search
None
See application file for complete search history.

(56) References Cited

U.S. PATENT DOCUMENTS 8,026,116 B2   9/2011  Tanaka
9,523,899 B2   12/2016 Wang
(Continued)

FOREIGN PATENT DOCUMENTS

CN    101236343 A    8/2008
CN    101718934 A    6/2010
(Continued)

*Primary Examiner* — Kevin M Picardat
(74) *Attorney, Agent, or Firm* — Ladas & Parry LLP

(57) ABSTRACT

A 3T pixel structure is provided. The 3T pixel structure includes: a substrate, on which a lower common electrode and a scan line are positioned; a first dielectric layer, positioned on the lower common electrode, the scan line and the substrate; a charge-sharing thin film transistor (TFT), including a source, a drain, and a gate, the source and the drain of the charge-sharing TFT being positioned on the first dielectric layer; a data line, positioned on the first dielectric layer; a second dielectric layer, positioned on the source, the drain, the data line of the charge-sharing TFT and the first dielectric layer; and an upper common electrode, positioned on the second dielectric layer. The second dielectric layer has a source hole to allow the upper common electric layer to contact the first source and electrically connect to the first source through the source hole.

13 Claims, 1 Drawing Sheet

(51) Int. Cl.
*G02F 1/1343* (2006.01)
*G02F 1/1368* (2006.01)
*H01L 27/12* (2006.01)

(52) U.S. Cl.
CPC .. *G02F 1/134336* (2013.01); *G02F 1/136227* (2013.01); *H01L 27/124* (2013.01); *H01L 27/1218* (2013.01); *H01L 27/1248* (2013.01); *H01L 27/1255* (2013.01); *G02F 2001/13629* (2013.01); *G02F 2001/134318* (2013.01); *G02F 2201/123* (2013.01)

(56) References Cited

U.S. PATENT DOCUMENTS

| | | | |
|---|---|---|---|
| 9,728,112 B2 | 8/2017 | Chen et al. | |
| 2009/0027581 A1* | 1/2009 | You | G02F 1/13624 349/48 |
| 2012/0224128 A1* | 9/2012 | Jung | G02F 1/134309 349/129 |
| 2014/0204008 A1* | 7/2014 | Chu-Ke | G09G 3/2003 345/88 |
| 2016/0246140 A1* | 8/2016 | Que | G02F 1/1368 |
| 2016/0252791 A1* | 9/2016 | Chai | G02F 1/1368 257/59 |

FOREIGN PATENT DOCUMENTS

| | | |
|---|---|---|
| CN | 104460148 A | 3/2015 |
| CN | 104503158 A | 4/2015 |
| JP | 2003-344866 A | 12/2003 |

\* cited by examiner

3T PIXEL STRUCTURE AND RELATED LIQUID CRYSTAL DISPLAY

BACKGROUND OF THE INVENTION

1. Field of the Invention

The invention relates to a liquid crystal display (LCD), and more particularly, to a 3T pixel structure and related LCD.

2. Description of the Prior Art

Because the requirements of luminance, angle of view, contrast, response efficiency of the LCD panels are getting higher, the IPS(FFS)-type or VA-type LCD products are introduced to replace the original TN-type LCD products. In addition, the size of a pixel is getting smaller because of the high resolution. Therefore, the aperture ratio becomes smaller and this affects the luminance. In order to solve this problem, 3T pixel structure of the VA-type LCD is introduced. The 3T pixel structure removes the holes above the sub-pixel to raise the aperture ratio. However, it also introduces deep and shallow holes inside the pixel and thus increases the diameter of the holes. In addition, this also increases the size of the inner holes of the pixel structure. Furthermore, the deep and shallow holes overlaps inside the pixel. This increases the manufacturing difficulties and may decrease the yield.

Therefore, the conventional structure needs to be improved.

SUMMARY OF THE INVENTION

It is therefore one of the primary objectives of the claimed invention to provide a 3T pixel structure and an LCD to solve the above-mentioned problems of overlapped deep and shallow holes inside the 3T pixel structure and related LCD.

According to an exemplary embodiment of the claimed invention, a 3T pixel structure is provided. The 3T pixel structure comprises: a substrate, on which a lower common electrode and a scan line are positioned; a first dielectric layer, positioned on the lower common electrode, the scan line and the substrate; a charge-sharing thin film transistor (TFT), comprising a source, a drain, and a gate, the source and the drain of the charge-sharing TFT being positioned on the first dielectric layer; a data line, positioned on the first dielectric layer; a second dielectric layer, positioned on the source, the drain, the data line of the charge-sharing TFT and the first dielectric layer; and an upper common electrode, positioned on the second dielectric layer; wherein second dielectric layer has a source hole to allow the upper common electric layer to contact the first source and electrically connect to the first source through the source hole.

Furthermore, the 3T pixel structure further comprises a third dielectric layer positioned on the upper common electrode and the second dielectric layer, and a pixel electrode layer positioned on the third dielectric layer.

Furthermore, the 3T pixel structure further comprises a main pixel TFT and a sub-pixel TFT. The main pixel TFT comprises a source, a drain, and a gate. The source, the drain, and the gate of the main pixel TFT are positioned on the first dielectric layer. The sub-pixel TFT comprises a source, a drain, and a gate. The source, the drain, and the gate of the sub-pixel TFT are positioned on the first dielectric layer. The gate of the charge-sharing TFT is positioned on the second dielectric layer.

Furthermore, the source of the main pixel TFT is electrically connected to the drain of the sub-pixel TFT, the source of the sub-pixel TFT is electrically connected to the drain of the charge-sharing TFT, the gates of the main pixel TFT, the sub-pixel TFT, and the charge-sharing TFT are all electrically connected to the scan line.

Furthermore, the 3T pixel structure further comprises a main pixel TFT and a sub-pixel TFT. The main pixel TFT comprises a source, a drain, and a gate. The source, the drain, andt he gate of the main pixel TFT are positioned on the first dielectric layer. The sub-pixel TFT comprises a source, a drain, and a gate. The source, and the drain, and the gate of the sub-pixel TFT are positioned on the first dielectric layer. The gate of the charge-sharing TFT is positioned on the second dielectric layer.

Furthermore, the 3T pixel structure further comprises a first capacitor and a second capacitor. The first capacitor is formed by a first plate positioned on the first dielectric layer and a portion of the lower common electrode corresponding to the first plate. The second capacitor is formed by formed by a second plate positioned on the first dielectric layer and a portion of the lower common electrode corresponding to the second plate. The first plate is electrically connected to the drain of the main pixel TFT, and the second plate is electrically connected to the source of the sub-pixel TFT and the drain of the charge-sharing TFT.

Furthermore, the source of the sub-pixel TFT contacts and electrically connects to the drain of the charge-sharing TFT, and a common node of the source of the sub-pixel TFT and the drain of the charge-sharing TFT is electrically connected to the second plate. Furthermore, the substrate is a transparent glass substrate or a transparent plastic substrate.

Furthermore, the upper common electrode has a grid shape. Furthermore, the first dielectric layer and the second dielectric layer are implemented with silicon nitride and/or silicon dioxide.

The present disclosure also proposes a liquid crystal display comprising the above mentioned 3T pixel structure.

In contrast to the related art, which connects the source of the charge-sharing TFT to the lower common electrode through the corporation of the deep hole and the shallow hole, an exemplary embodiment electrically connects the source of the charge-sharing TFT to the upper common electrode through the source hole of the second dielectric layer. This does not require the structure of overlapped deep and shallow holes and thus increases the aperture ratio.

Furthermore, because the source of the sub-pixel TFT and the drain of charge-sharing TFT contact each other and electrically connect to each other, the inner resistances of the sub-pixel TFT and the charge-sharing TFT simultaneously vary. This decreases the ratio of the inner resistances and thus reduces the influences on mura and decreases the parasitic capacitance.

DETAILED DESCRIPTION OF THE PREFERRED EMBODIMENT

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

These and other objectives of the claimed invention will no doubt become obvious to those of ordinary skill in the art after reading the following detailed description of the preferred embodiment that is illustrated in the various figures and drawings.

Figure 1:
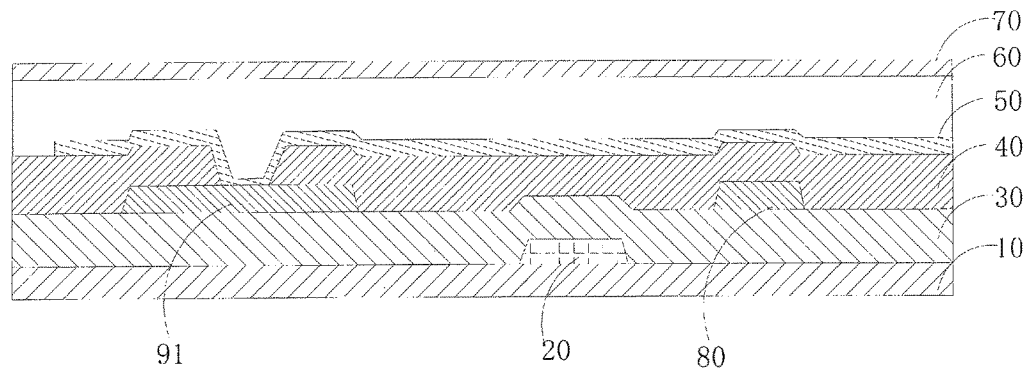
FIG. 1 is a diagram of a 3T pixel structure according to an exemplary embodiment.
Figure 2:
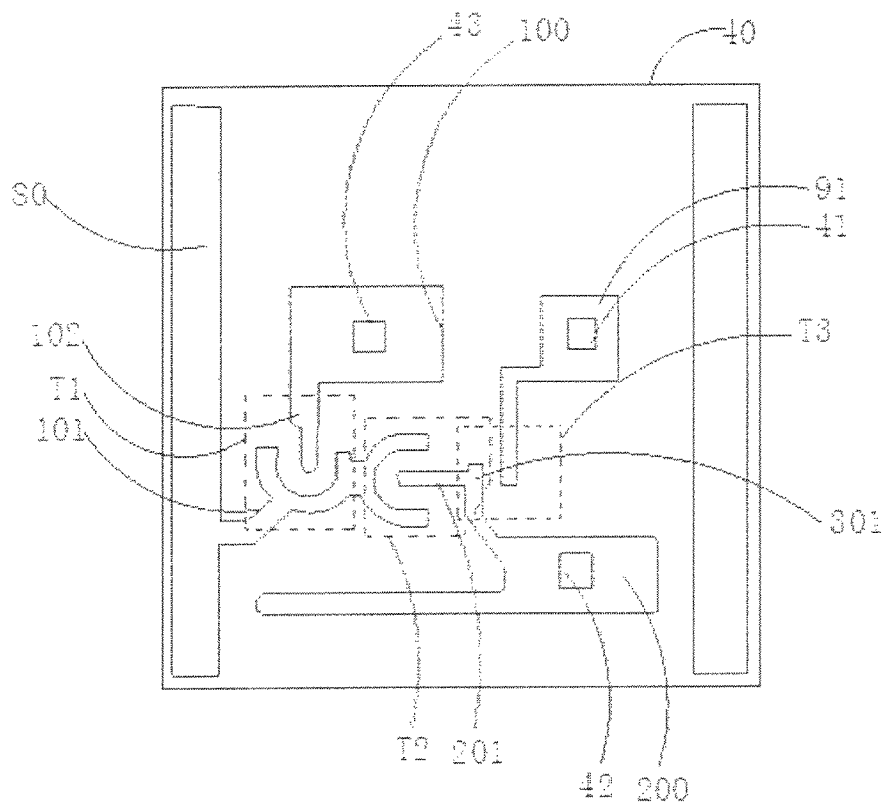
FIG. 2 is a perspective view of a part of the 3T pixel structure shown in FIG. 1.

FIG. 1 is a diagram of a 3T pixel structure according to an exemplary embodiment. FIG. 2 is a perspective view of a part of the 3T pixel structure shown in FIG. 1. Please refer to FIG. 1 in conjunction with FIG. 2. The 3T structure of the exemplary embodiment comprises: a substrate 10, a lower common electrode 20, a scan line (not shown), a first dielectric layer 30, a main pixel thin film transistor (TFT) T1, a sub TFT T2, a charge-sharing TFT T3, a data line 80, a second dielectric layer 40, an upper common electrode 50, a third dielectric layer 60, and a pixel electrode layer 70.

The lower common electrode 20 and the scan line are both positioned on the substrate 10.

The data line 80 is positioned on the first dielectric layer 30. The main pixel TFT T1, the sub-pixel TFT T2, and the charge-sharing TFT T3 are positioned on the first dielectric layer 30. The upper common electrode 50 is positioned on the second dielectric layer 40. The third dielectric layer 60 is positioned on the common electrode 50. The pixel electrode layer 70 is positioned on the third dielectric layer 60.

Specifically, each of the main pixel TFT T1, the sub-pixel TFT T2, and the charge sharing TFT T3 comprises a source, a drain, and a gate. The sources, the drains, and the gates of the main pixel TFT T1, the sub-pixel TFT T2, and the charge sharing TFT T3 are all positioned on the first dielectric layer 30. However, this is only an embodiment, not a limitation. The gates of the main pixel TFT T1, the sub-pixel TFT T2, and the charge sharing TFT T3 can be positioned in another layer. This also obeys the spirit of the present invention. The source of the main pixel TFT T1 is electrically connected to the drain of the sub-pixel TFT T2. The source of the main pixel TFT T1 is the second source 101. The source of the sub-pixel TFT T2 is electrically connected to the drain of the charge-sharing TFT T3. The source of the sub-pixel TFT T2 is the third source 201. The drain of the charge-sharing TFT T3 is the first drain 301. The source of the charge-sharing TFT T3 is the first source 91. The first source 91 is electrically connected to the upper common electrode 50. In this embodiment, the second dielectric 40 has a source hole 41. The upper common electrode 50 is electrically connected to the first source 90 through the source hole 41. In contrast to the related art, which connects the source of the charge-sharing TFT T3 to the lower common electrode 20, the first source 90 is electrically connected to the upper common electrode 50 in this exemplary embodiment. This does not require the structure of the overlapped deep and shallow holes and thus increases the aperture ratio. Furthermore, it also reduces the potential influences introduced by the overlapped deep and shallow holes.

The gates of the main pixel TFT T1, the sub-pixel TFT T2, and the charge-sharing TFT T3 are all electrically connected to the scan line.

The first plate 100 and the second plate 200 are positioned on the first dielectric layer 30. The first plate 100 is electrically connected to the drain of the main pixel TFT T1, the second drain 102. The second plate 200 is electrically connected to the source of the sub-pixel TFT T2 and the drain of the charge-sharing TFT T3. The first capacitor of the 3T pixel structure is formed by the first plate 100 and a portion of the lower common electrode 20 corresponding to the first plate 100. The second capacitor of the 3T pixel structure is formed by the second plate 200 and a portion of the lower common electrode 20 corresponding to the second plate 200.

The second dielectric layer 40 comprises a first hole 43. The third dielectric layer 60 comprises a second hole (not shown). The pixel electrode layer 70 contacts and electrically connects to the first plate 100 through the first hole 43 and the second hole. The second dielectric layer 40 comprises a third hole 42. The third dielectric layer 60 comprises a fourth hole. The pixel electrode 40 contacts and electrically connects to the second plate 200 through the third hole 42 and the fourth hole.

In a preferred embodiment, the source of the sub-pixel TFT T2 (the third source 201) contacts and electrically connects to the drain of the charge-sharing TFT T3 (the first drain 301) and the common node of the third source 201 and the first drain 301 is electrically connected to the second plate 100. In contrast to the related art, which separates the source of the sub-pixel TFT T2 and the drain of the charge-sharing TFT T3, the exemplary embodiment allows the inner resistances of sub-pixel TFT T2 and charge-sharing TFT T3 simultaneously vary because the source of the sub-pixel TFT and the drain of the charge-sharing TFT contact each other and electrically connect to each other. Therefore, the inner resistances of the sub-pixel TFT and the charge-sharing TFT simultaneously vary. This decreases the ratio of the inner resistances and thus reduces the influences on mura and decreases the parasitic capacitance.

In an embodiment, the source of the sub-pixel TFT T2 and the drain of the charge-sharing TFT T3 can be electrically connected to each other without directing contacting each other. For example, the source of the sub-pixel TFT T2 and the drain of the charge-sharing TFT T3 can be respectively coupled to the second plate 200.

The substrate 10 is a transparent glass substrate or a transparent plastic substrate.

The upper common electrode 50 has a grid shape, which can reduce the conductive inefficiency caused by local disconnection of the common electrode 50.

The first dielectric layer 30, the second dielectric layer 40, and the third dielectric layer 60 can be manufactured with silicon nitride and/or silicon dioxide through a chemical vapor deposition (CVD) manufacturing process.

In contrast to the related art, the source of the charge-sharing TFT (the first source) contacts and electrically connects to the upper common electrode through the source hole of the second dielectric layer. This does not require the structure of overlapped deep and shallow holes and thus increases the aperture ratio.

Furthermore, because the source of the sub-pixel TFT and the drain of charge-sharing TFT contact each other and electrically connect to each other, the inner resistances of the sub-pixel TFT and the charge-sharing TFT simultaneously vary. This decreases the ratio of the inner resistances and thus reduces the influences on mura and decreases the parasitic capacitance.

While the present invention has been described in connection with what is considered the most practical and preferred embodiments, it is understood that this invention is not limited to the disclosed embodiments but is intended to cover various arrangements made without departing from the scope of the broadest interpretation of the appended claims.

What is claimed is:

1. A 3T pixel structure, comprising:
    a substrate, on which a lower common electrode and a scan line are positioned;
    a first dielectric layer, positioned on the lower common electrode, the scan line and the substrate;
    a charge-sharing thin film transistor (TFT), comprising a source, a drain, and a gate, the source and the drain of the charge-sharing TFT being positioned on the first dielectric layer;
    a data line, positioned on the first dielectric layer;
    a second dielectric layer, positioned on the source, the drain, the data line of the charge-sharing TFT and the first dielectric layer; and
    an upper common electrode, positioned on the second dielectric layer;
    wherein the second dielectric layer has a source hole to allow the upper common electric layer to contact the first source and electrically connect to the first source through the source hole;
    further comprising a third dielectric layer, positioned on the upper common electrode and the second dielectric layer; and a pixel electrode layer, positioned on the third dielectric layer;
    a main pixel TFT, comprising a source, a drain, and a gate, the source, the drain, and the gate of the main pixel TFT being positioned on the first dielectric layer; and a sub-pixel TFT, comprising a source, a drain, and a gate, the source, the drain, and the gate of the sub-pixel TFT being positioned on the first dielectric layer,
    wherein the gate of the charge-sharing TFT is positioned on the second dielectric layer; and
    wherein the source of the main pixel TFT is electrically connected to the drain of the sub-pixel TFT, the source of the sub-pixel TFT is electrically connected to the drain of the charge-sharing TFT, the gates of the main pixel TFT, the sub-pixel TFT, and the charge-sharing TFT are all electrically connected to the scan line.

2. The 3T pixel structure of claim 1, further comprising:
    a first capacitor, formed by a first plate positioned on the first dielectric layer and a portion of the lower common electrode corresponding to the first plate; and
    a second capacitor, formed by formed by a second plate positioned on the first dielectric layer and a portion of the lower common electrode corresponding to the second plate,
    wherein the first plate is electrically connected to the drain of the main pixel TFT, and the second plate is electrically connected to the source of the sub-pixel TFT and the drain of the charge-sharing TFT.

3. The 3T pixel structure of claim 1, wherein the substrate is a transparent glass substrate or a transparent plastic substrate.

4. The 3T pixel structure of claim 1, wherein the upper common electrode has a grid shape.

5. The 3T pixel structure of claim 1, wherein the first dielectric layer and the second dielectric layer are implemented with silicon nitride and/or silicon dioxide.

6. A 3T pixel structure, comprising:
    a substrate, on which a lower common electrode and a scan line are positioned;
    a first dielectric layer, positioned on the lower common electrode, the scan line and the substrate;
    a charge-sharing thin film transistor (TFT), comprising a source, a drain, and a gate, the source and the drain of the charge-sharing TFT being positioned on the first dielectric layer;
    a data line, positioned on the first dielectric layer;
    a second dielectric layer, positioned on the source, the drain, the data line of the charge-sharing TFT and the first dielectric layer; and
    an upper common electrode, positioned on the second dielectric layer;
    wherein second dielectric layer has a source hole to allow the upper common electric layer to contact the first source and electrically connect to the first source through the source hole;
    further comprising a first capacitor, formed by a first plate positioned on the first dielectric layer and a portion of the lower common electrode corresponding to the first plate; and a second capacitor, formed by formed by a second plate positioned on the first dielectric layer and a portion of the lower common electrode corresponding to the second plate,
    wherein the first plate is electrically connected to the drain of the main pixel TFT, and the second plate is electrically connected to the source of the sub-pixel TFT and the drain of the charge-sharing TFT.

7. The 3T pixel structure of claim 6, wherein the source of the sub-pixel TFT contacts and electrically connects to the drain of the charge-sharing TFT, and a common node of the source of the sub-pixel TFT and the drain of the charge-sharing TFT is electrically connected to the second plate.

8. A 3T pixel structure, comprising:
    a substrate, on which a lower common electrode and a scan line are positioned;
    a first dielectric layer, positioned on the lower common electrode, the scan line and the substrate;
    a charge-sharing thin film transistor (TFT), comprising a source, a drain, and a gate, the source and the drain of the charge-sharing TFT being positioned on the first dielectric layer;
    a data line, positioned on the first dielectric layer;
    a second dielectric layer, positioned on the source, the drain, the data line of the charge-sharing TFT and the first dielectric layer;
    an upper common electrode, positioned on the second dielectric layer, wherein the second dielectric layer has a source hole to allow the upper common electric layer to contact the first source and electrically connect to the first source through the source hole;
    a third dielectric layer, positioned on the upper common electrode and the second dielectric layer;
    a pixel electrode layer, positioned on the third dielectric layer;
    a main pixel TFT, comprising a source, a drain, and a gate, the source, the drain, and the gate of the main pixel TFT being positioned on the first dielectric layer;
    a sub-pixel TFT, comprising a source, a drain, and a gate, the source, the drain, and the gate of the sub-pixel TFT being positioned on the first dielectric layer, wherein the gate of the charge-sharing TFT is positioned on the second dielectric layer, the source of the main pixel TFT is electrically connected to the drain of the sub-pixel TFT, the source of the sub-pixel TFT is electrically connected to the drain of the charge-sharing TFT, the gates of the main pixel TFT, the sub-pixel TFT, and the charge-sharing TFT are all electrically connected to the scan line;
    a first capacitor, formed by a first plate positioned on the first dielectric layer and a portion of the lower common electrode corresponding to the first plate; and
    a second capacitor, formed by formed by a second plate positioned on the first dielectric layer and a portion of the lower common electrode corresponding to the second plate, wherein the first plate is electrically connected to the drain of the main pixel TFT, and the second plate is electrically connected to the source of the sub-pixel TFT and the drain of the charge-sharing TFT;

wherein the source of the sub-pixel TFT contacts and electrically connects to the drain of the charge-sharing TFT, and a common node of the source of the sub-pixel TFT and the drain of the charge-sharing TFT is electrically connected to the second plate.

9. A liquid crystal display, comprising a 3T pixel structure, the 3T pixel structure comprising:

a substrate, on which a lower common electrode and a scan line are positioned;

a first dielectric layer, positioned on the lower common electrode, the scan line and the substrate;

a charge-sharing thin film transistor (TFT), comprising a source, a drain, and a gate, the source and the drain of the charge-sharing TFT being positioned on the first dielectric layer;

a data line, positioned on the first dielectric layer;

a second dielectric layer, positioned on the source, the drain, the data line of the charge-sharing TFT and the first dielectric layer; and an upper common electrode, positioned on the second dielectric layer;

wherein the second dielectric layer has a source hole to allow the upper common electric layer to contact the first source and electrically connect to the first source through the source hole;

the 3T pixel structure further comprises a third dielectric layer, positioned on the upper common electrode and the second dielectric layer; and a pixel electrode layer, positioned on the third dielectric layer;

wherein the 3T pixel structure further comprises:

a main pixel TFT, comprising a source, a drain, and a gate, the source, the drain, and the gate of the main pixel TFT being positioned on the first dielectric layer; and a sub-pixel TFT, comprising a source, a drain, and a gate, the source, the drain, and the gate of the sub-pixel TFT being positioned on the first dielectric layer, wherein the gate of the charge-sharing TFT is positioned on the second dielectric layer; and wherein the source of the main pixel TFT is electrically connected to the drain of the sub-pixel TFT, the source of the sub-pixel TFT is electrically connected to the drain of the charge-sharing TFT, the gates of the main pixel TFT, the sub-pixel TFT, and the charge-sharing TFT are all electrically connected to the scan line.

10. The liquid crystal display of claim 9, wherein the substrate is a transparent glass substrate or a transparent plastic substrate.

11. The liquid crystal display of claim 9, wherein the upper common electrode has a grid shape.

12. A liquid crystal display, comprising a 3T pixel structure, the 3T pixel structure comprising:

a substrate, on which a lower common electrode and a scan line are positioned;

a first dielectric layer, positioned on the lower common electrode, the scan line and the substrate;

a charge-sharing thin film transistor (TFT), comprising a source, a drain, and a gate, the source and the drain of the charge-sharing TFT being positioned on the first dielectric layer;

a data line, positioned on the first dielectric layer;

a second dielectric layer, positioned on the source, the drain, the data line of the charge-sharing TFT and the first dielectric layer; and an upper common electrode, positioned on the second dielectric layer;

wherein the second dielectric layer has a source hole to allow the upper common electric layer to contact the first source and electrically connect to the first source through the source hole;

wherein the 3T pixel structure further comprises:

a first capacitor, formed by a first plate positioned on the first dielectric layer and a portion of the lower common electrode corresponding to the first plate; and a second capacitor, formed by formed by a second plate positioned on the first dielectric layer and a portion of the lower common electrode corresponding to the second plate, wherein the first plate is electrically connected to the drain of the main pixel TFT, and the second plate is electrically connected to the source of the sub-pixel TFT and the drain of the charge-sharing TFT.

13. A liquid crystal display, comprising a 3T pixel structure, the 3T pixel structure comprising:

a substrate, on which a lower common electrode and a scan line are positioned;

a first dielectric layer, positioned on the lower common electrode, the scan line and the substrate;

a charge-sharing thin film transistor (TFT), comprising a source, a drain, and a gate, the source and the drain of the charge-sharing TFT being positioned on the first dielectric layer;

a data line, positioned on the first dielectric layer;

a second dielectric layer, positioned on the source, the drain, the data line of the charge-sharing TFT and the first dielectric layer; and an upper common electrode, positioned on the second dielectric layer;

wherein the second dielectric layer has a source hole to allow the upper common electric layer to contact the first source and electrically connect to the first source through the source hole;

wherein the source of the sub-pixel TFT contacts and electrically connects to the drain of the charge-sharing TFT, and a common node of the source of the sub-pixel TFT and the drain of the charge-sharing TFT is electrically connected to the second plate.

* * * * *